(12) United States Patent
Park et al.

(10) Patent No.: US 10,211,749 B2
(45) Date of Patent: Feb. 19, 2019

(54) DATA PROCESSING DEVICE AND METHOD FOR HIGH VOLTAGE DIRECT CURRENT TRANSMISSION SYSTEM

(71) Applicant: LSIS CO., LTD., Anyang-si, Gyeonggi-do (KR)

(72) Inventors: Ho Hwan Park, Suwon-si (KR); Ming Sheng, Busan (KR); Iwa Kartiwa, Anyang-si (KR)

(73) Assignee: LSIS CO., LTD., Anyang-si, Gyeonggi-Do (KR)

( * ) Notice: Subject to any disclaimer, the term of this patent is extended or adjusted under 35 U.S.C. 154(b) by 310 days.

(21) Appl. No.: 14/711,587

(22) Filed: May 13, 2015

(65) Prior Publication Data

US 2015/0333651 A1  Nov. 19, 2015

(30) Foreign Application Priority Data

May 14, 2014 (KR) .................... 10-2014-0058072

(51) Int. Cl.
| | |
|---|---|
| *G01R 19/25* | (2006.01) |
| *G01R 19/252* | (2006.01) |
| *H02M 5/42* | (2006.01) |
| *H02M 5/44* | (2006.01) |
| *G08C 23/06* | (2006.01) |
| *H04Q 9/00* | (2006.01) |
| *H04J 14/02* | (2006.01) |

(52) U.S. Cl.
CPC .............. *H02M 5/44* (2013.01); *G08C 23/06* (2013.01); *H04Q 9/00* (2013.01); *G01R 19/252* (2013.01); *G01R 19/2513* (2013.01); *H04J 14/02* (2013.01)

(58) Field of Classification Search
CPC ............ H02M 5/44; G08C 23/06; H04Q 9/00
USPC .......................................................... 702/64
See application file for complete search history.

(56) References Cited

U.S. PATENT DOCUMENTS 5,182,667 A    1/1993  Shibata et al.
5,596,671 A *  1/1997  Rockwell, III ........ G02B 6/001
                                                    385/147
(Continued)

FOREIGN PATENT DOCUMENTS

CN    1881744    12/2006
CN    101194171   6/2008
(Continued)

OTHER PUBLICATIONS

European Patent Office Application Serial No. 15165674.1, Search Report dated Oct. 23, 2015, 8 pages.
(Continued)

*Primary Examiner* — Ly D Pham
(74) *Attorney, Agent, or Firm* — K&L Gates LLP

(57) ABSTRACT

A data processing device in a high voltage direct current (HVDC) transmission system is provided. The data processing device includes a measurement module measuring a voltage or current for one or more points in the HVDC system; a data processing unit generating measurement data units using measurement values measured at the measurement module; and a communication module using wavelength division multiplexing to transmit the measurement data units to the outside through one optical fiber, wherein the optical fiber includes a plurality of cores.

8 Claims, 12 Drawing Sheets

(56) References Cited

U.S. PATENT DOCUMENTS

| | | | | |
|---|---|---|---|---|
| 8,886,476 B1* | 11/2014 | Taft | | H04B 3/542 700/286 |
| 9,509,399 B2* | 11/2016 | Kasztenny | | H04B 10/0791 |
| 2003/0108280 A1* | 6/2003 | Puzey | | H04B 10/505 385/24 |
| 2005/0128751 A1* | 6/2005 | Roberge | | F21K 9/00 362/276 |
| 2006/0022214 A1* | 2/2006 | Morgan | | F21K 9/00 257/99 |
| 2007/0058988 A1* | 3/2007 | Yonenaga | | H04B 10/5051 398/186 |
| 2008/0198037 A1* | 8/2008 | Hugelschafer | | H04L 25/4904 340/870.01 |
| 2008/0212342 A1* | 9/2008 | Karlecik-Maier | | H02J 3/36 363/35 |
| 2008/0219678 A1* | 9/2008 | Doi | | G02F 1/0123 398/198 |
| 2009/0024337 A1* | 1/2009 | Ackermann | | G01R 19/2513 702/57 |
| 2010/0202785 A1* | 8/2010 | Kawanishi | | H04B 10/505 398/185 |
| 2011/0122654 A1* | 5/2011 | Haefner | | G01R 15/246 363/13 |
| 2011/0285399 A1* | 11/2011 | Ordones | | G01R 31/11 324/509 |
| 2012/0020614 A1* | 1/2012 | Han | | G02B 6/125 385/17 |
| 2012/0189303 A1* | 7/2012 | Winzer | | H04J 14/02 398/43 |
| 2014/0125137 A1* | 5/2014 | Couture | | H02J 13/0065 307/98 |
| 2014/0140694 A1* | 5/2014 | Zhou | | H04J 14/04 398/44 |
| 2014/0241712 A1* | 8/2014 | Sugawara | | G02B 6/02042 398/5 |
| 2014/0266233 A1* | 9/2014 | Brower | | G01R 31/14 324/509 |
| 2015/0222561 A1* | 8/2015 | Okuno | | H04L 47/522 370/235 |
| 2016/0320556 A1* | 11/2016 | Nasilowski | | G02B 6/02042 |
| 2017/0019178 A1* | 1/2017 | Alic | | H04B 10/2543 |

FOREIGN PATENT DOCUMENTS

| | | |
|---|---|---|
| CN | 101893670 | 11/2010 |
| CN | 103731209 | 4/2014 |
| EP | 2116854 | 11/2009 |
| GB | 2500717 | 10/2013 |
| JP | 61-278226 | 12/1986 |
| JP | 1-150871 | 6/1989 |
| JP | 8-19168 | 1/1996 |
| JP | H09312934 | 12/1997 |
| KR | 10-2001-0112222 | 12/2001 |
| KR | 10-2006-0083367 | 7/2006 |
| KR | 10-2012-0127531 | 11/2012 |
| KR | 10-2014-0032494 | 3/2014 |
| KR | 10-2014-0032567 | 3/2014 |
| WO | 2011/147459 | 12/2011 |

OTHER PUBLICATIONS

Japan Patent Office Application Serial No. 2015-099206, Office Action dated May 31, 2016, 2 pages.
Korean Intellectual Property Office Application Serial No. 10-2014-0058072, Office Action dated Nov. 20, 2015, 4 pages.
Japan Patent Office Application No. 2015-099206, Notice of Allowance dated Dec. 20, 2016, 3 pages.
State Intellectual Property Office of the People's Republic of China Application Serial No. 201510350118.1, Notice of Allowance dated Jan. 5, 2017, 6 pages.
State Intellectual Property Office of the People's Republic of China Application Serial No. 201510350118.1, Office Action dated Sep. 13, 2017, 7 pages.

* cited by examiner

CONFIGURATION OF MEASUREMENT DATA PACKET

DATA PROCESSING DEVICE AND METHOD FOR HIGH VOLTAGE DIRECT CURRENT TRANSMISSION SYSTEM

CROSS-REFERENCE TO RELATED APPLICATIONS

Pursuant to 35 U.S.C. § 119(a), this application claims the benefit of earlier filing date and right of priority to Korean Patent Application No(s). 10-2014-0058072, filed on May 14, 2014, the contents of which are all hereby incorporated by reference herein in its entirety.

BACKGROUND

The present disclosure relates to a data processing device and method for a high voltage direct current (HVDC) transmission system.

According to a high voltage direct current (HVDC) transmission system, after a transmission site converts AC power produced at a power station into DC power and then transmits the DC power, a reception site re-converts DC power into AC power and then supplies power.

An HVDC system is applied to submarine cable power transmission, large-amount long-distance power transmission, interconnection between AC systems, etc. Also, the HVDC transmission system enables different frequency system interconnection and asynchronism interconnection.

The transmission site converts the AC power into the DC power. That is, since transmitting the AC power by using a submarine cable is significantly dangerous, the transmission site converts the AC power into the DC power to transmit the DC power to the reception site.

Such an HVDC transmission system controls a system by using a measurement value for a voltage/current at one or more points.

A typical HVDC transmission system has transmitted data on the measurement value through time division multiplexing (TDM). When the HVDC transmission system transmits measured data by using serial transmission through the TDM, it is possible to minimize optical cable usage but the TDM has a limitation in that it is sensitive to transmission synchronization.

Also, when the measured data is transmitted by using the TDM, there is a limitation in that the bottleneck of a channel increases with an increase in the number of measurement modules.

SUMMARY

Embodiments provide a data processing device for a high voltage direct current (HVDC) transmission system insensitive to transmission synchronization.

Embodiments also provide a data processing device for an HVDC transmission system that may satisfy system requirements even when the number of measurement modules (or data unit generation part) because measured data is transmitted in parallel by using wavelength division multiplexing (WDM).

Embodiments also provide a data processing device for the HVDC transmission system that decreases the number of cable lines and simplifies the structure of a system.

In one embodiment, a data processing device in a high voltage direct current (HVDC) transmission system includes a measurement module measuring a voltage or current for one or more points in the HVDC system; a data processing unit generating measurement data units using measurement values measured at the measurement module; and a communication module using wavelength division multiplexing to transmit the measurement data units to the outside through one optical fiber, wherein the optical fiber includes a plurality of cores.

The plurality of cores may correspond respectively to one or more measurement data units, and the communication module transmits the measurement data units to the outside through the plurality of cores, respectively.

The data processing unit may include a plurality of data unit generation parts, and each of the plurality of data unit generation parts uses the measurement values measured at the measurement module to generate a measurement data unit, and transmits the generated measurement data unit to the communication module.

The plurality of cores may correspond respectively to the plurality of data unit generation parts configuring the data processing unit.

The plurality of cores may correspond respectively to at least two data unit generation parts.

The communication module may transmit the measurement data units through one optical fiber in parallel.

The communication module may allocate a plurality of wavelength bands to the measurement data units respectively and transmits the measurement data units.

The data processing device may further include a control unit coding the measurement data units and transmitting a coding result to the outside.

Each of the data unit generation parts may pre-process the measurement values measured at the measurement module to generate pre-processed measurement data units.

The details of one or more embodiments are set forth in the accompanying drawings and the description below. Other features will be apparent from the description and drawings, and from the claims.

DETAILED DESCRIPTION OF THE EMBODIMENTS

Some embodiments are described below in more detail with reference to the accompanying drawings. Noun suffixes such as "part", "module", and "unit" for components in description below are given or mixed in consideration of easiness in writing the specification. That is, the noun suffixes themselves do not have respectively distinguishable meanings or roles.

Figure 1:
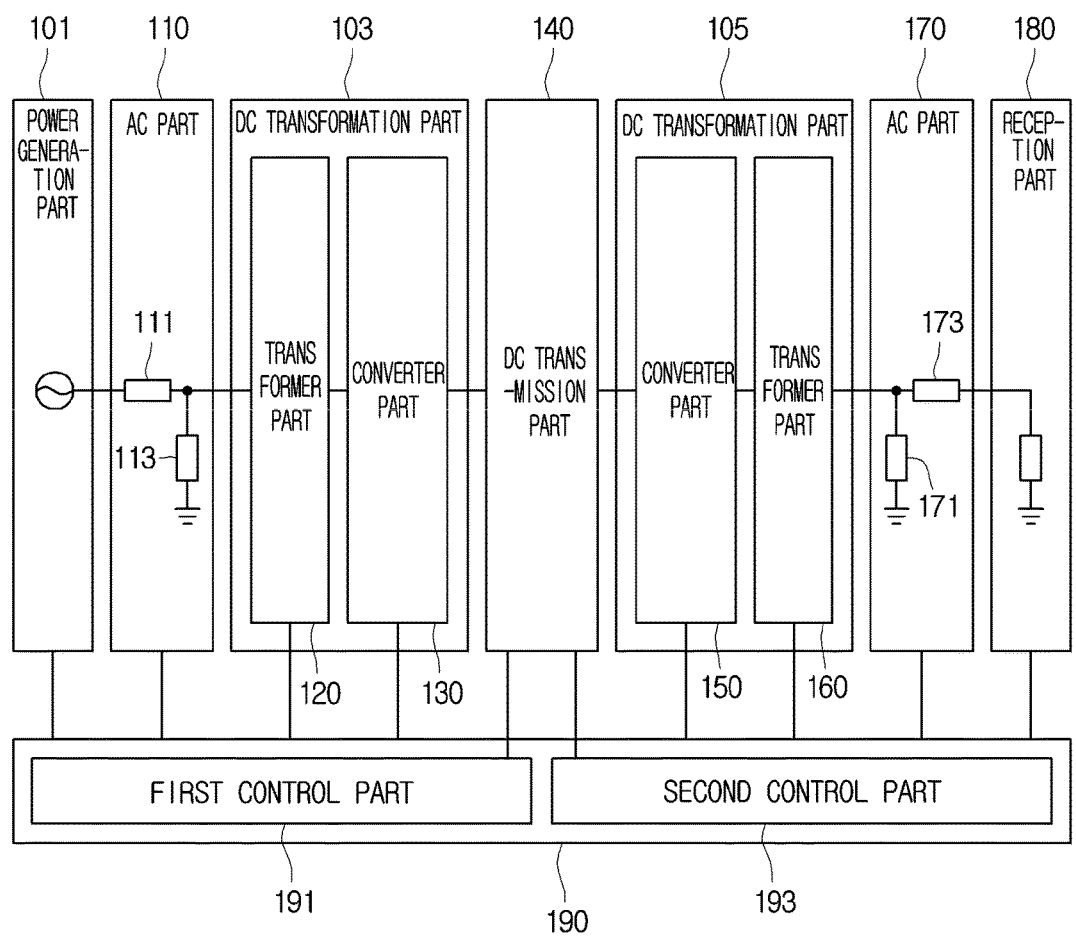
FIG. 1 shows a high voltage direct current (HVDC) transmission system according to an embodiment.

FIG. 1 shows a high voltage direct current (HVDC) transmission system according to an embodiment.

As shown in FIG. 1, an HVDC transmission system 100 according to an embodiment includes a power generation part 101, a transmission-side alternating current (AC) part 110, a transmission-side transformation part 103, a DC transmission part 140, a reception-side transformation part 105, a reception-side AC part 170, a reception part 180, and a control part 190. The transmission-side transformation part 103 includes a transmission-side transformer part 120, and a transmission-side AC/DC converter part 130. The reception-side transformation part 105 includes a reception-side AC/DC converter part 150, and a reception-side transformer part 160.

The power generation part 101 generates three-phase AC power. The power generation part 101 may include a plurality of power stations.

The transmission-side AC part 110 transmits the three-phase AC power generated by the power generation part 101 to a DC substation that includes the transmission-side transformer part 120 and the transmission-side AC/DC converter part 130.

The transmission-side transformer part 120 isolates the transmission-side AC part 110 from the transmission-side AC/DC converter part 130 and the DC transmission part 140.

The transmission-side AC/DC converter part 130 converts, into AC power, three-phase AC power corresponding to the output of the transmission-side transformer part 120.

The DC transmission part 140 transmits transmission-side DC power to a reception side.

The reception-side DC/AC converter part 150 converts DC power transmitted by the DC transmission part 140, into three-phase AC power.

The reception-side transformer part 160 isolates the reception-side AC part 170 from the reception-side DC/AC converter part 150 and the DC transmission part 140.

The reception-side AC part 170 provides, to the reception part 180, three-phase AC power corresponding to the output of the reception-side transformer part 160.

The control part 190 controls at least one of the power generation part 101, the transmission-side AC part 110, the transmission-side transformation part 103, the DC transmission part 140, the reception-side transformation part 105, the reception-side AC part 170, the reception part 180, the control part 190, the transmission-side AC/DC converter part 130, and the reception-side DC/AC converter part 150. In particular, the control part 190 may control the turn-on and turn-off timings of a plurality of valves in the transmission-side AC/DC converter part 130 and the reception-side DC/AC converter part 150. In this case, the valve may correspond to a thyristor or insulated gate bipolar transistor (IGBT).

Figure 2:
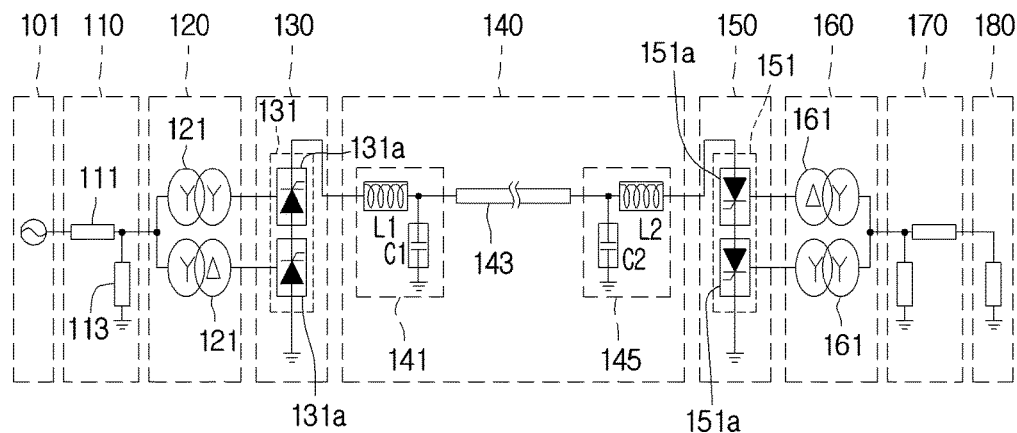
FIG. 2 shows a mono-polar HVDC transmission system according to an embodiment.

FIG. 2 shows a mono-polar HVDC transmission system according to an embodiment.

In particular, FIG. 2 shows a system transmitting single pole DC power. Although it is assumed in the following description that the single pole is a positive pole, there is no need to be limited thereto.

A transmission-side AC part 110 includes an AC transmission line 111 and an AC filter 113.

The AC transmission line 111 transmits three-phase AC power generated by the power generation part 101, to the transmission-side transformation part 103.

The AC filter 113 removes other frequency components excluding frequency components used by the transformation part 103, from the transmitted three-phase AC power.

The transmission-side transformer part 120 includes one or more transformers 121 for the positive pole. For the positive pole, the transmission-side AC-DC converter part 130 includes an AC/positive-pole DC converter 131 generating positive-pole DC power, and the AC/positive-pole DC converter 131 includes one or more three-phase valve bridges 131a corresponding to the one or more transformers 121, respectively.

When one three-phase bridge 131a is used, the AC/positive-pole DC converter 131 may use AC power to generate positive-pole DC power having six pulses. In this case, the primary and secondary coils of the transformer 121 may have a Y-Y connection or Y-Δ connection.

When two three-phase valve bridges 131a are used, the AC/positive-pole DC converter 131 may use AC power to generate positive-pole DC power having twelve pulses. In this case, the primary and secondary coils of one of two transformers 121 may have a Y-Y connection, and the primary and secondary coils of the other of two transformers 121 may have a Y-Δ connection.

When three three-phase valve bridges 131a are used, the AC/positive-pole DC converter 131 may use AC power to generate positive-pole DC power having eighteen pulses. The more the number of pulses of the positive-pole DC power, the price of the filter may decrease.

The DC transmission part 140 includes a transmission-side positive-pole DC filter 141, a positive-pole DC transmission line 143, and a reception-side positive-pole DC filter 145.

The transmission-side positive-pole DC filter 141 includes an inductor L1 and a capacitor C1 and DC-filters positive-pole DC power output by the AC/positive-pole DC converter 131.

The positive-pole DC transmission line 143 may have one DC line for transmission of positive-pole DC power, and earth may be used as a current feedback path. One or more switches may be disposed on the DC line.

The reception-side positive-pole DC filter 145 includes an inductor L2 and a capacitor C2 and DC-filters positive-pole DC power transmitted through the positive-pole DC transmission line 143.

The reception-side DC/AC converter part 150 includes a positive DC/AC converter 151, which includes one or more three-phase valve bridges 151a.

The reception-side transformer part 160 includes one or more transformers 161 corresponding respectively to one or more three-phase valve bridges 151a for the positive pole.

When one three-phase valve bridge 151a is used, the positive-pole DC/AC converter 151 may use positive-pole DC power to generate AC power having six pulses. In this case, the primary and secondary coils of the transformer 161 may have a Y-Y connection or Y-Δ connection.

When two three-phase valve bridges 151a are used, the positive-pole DC/AC converter 151 may use positive-pole DC power to generate AC power having twelve pulses. In this case, the primary and secondary coils of one of two transformers 161 may have a Y-Y connection, and the primary and secondary coils of the other of two transformers 161 may have a Y-Δ connection.

When three three-phase valve bridges 151a are used, the positive-pole DC/AC converter 151 may use positive-pole DC power to generate AC power having eighteen pulses. The more the number of pulses of the AC power, the price of the filter may decrease.

A reception-side AC part 170 includes an AC filter 171 and an AC transmission line 173.

The AC filter 171 removes other frequency components excluding the frequency component (e.g., about 60 Hz) used by the reception part 180, from the AC power generated by the reception-side transformation part 105.

The AC transmission line 173 transmits filtered AC power to the reception part 180.

Figure 3:
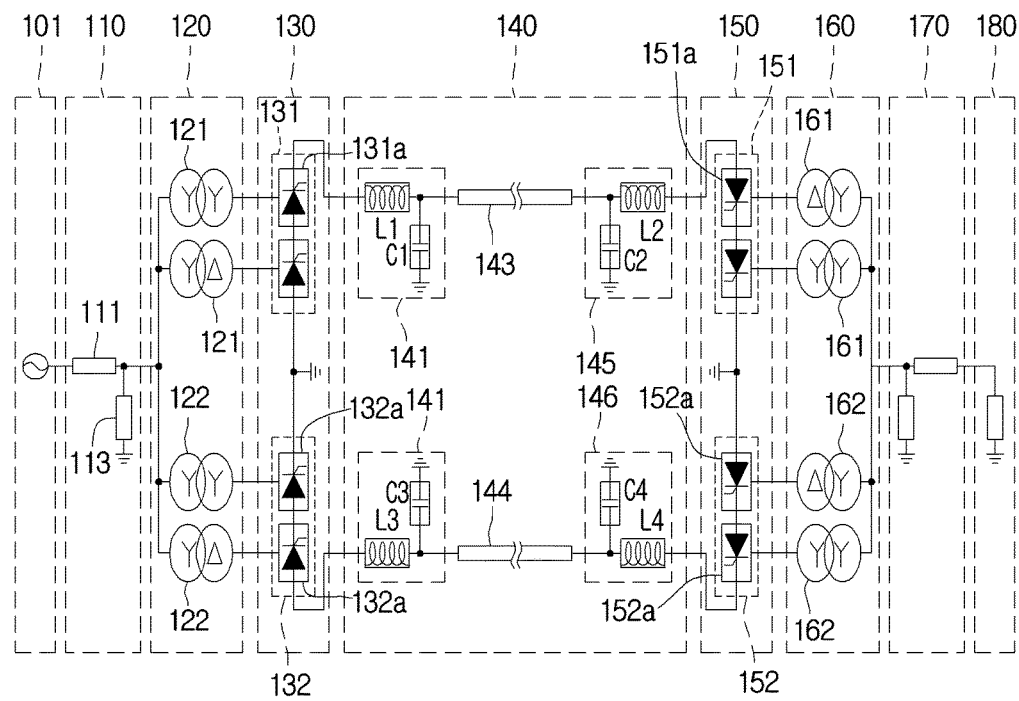
FIG. 3 shows a bipolar HVDC transmission system according to an embodiment.

FIG. 3 shows a bipolar HVDC transmission system according to an embodiment.

In particular, FIG. 3 shows a system transmitting two-pole DC power. Although it is assumed in the following description that the two poles are a positive pole and a negative pole, there is no need to be limited thereto.

A transmission-side AC part 110 includes an AC transmission line 111 and an AC filter 113.

The AC transmission line 111 transmits three-phase AC power generated by the power generation part 101, to the transmission-side transformation part 103.

The AC filter 113 removes other frequency components excluding frequency components used by the transformation part 103, from the transmitted three-phase AC power.

The transmission-side transformer part 120 includes one or more transformers 121 for the positive pole and one or more transformers 122 for the negative pole. A transmission-side AC/DC converter part 130 includes an AC/positive-pole DC converter 131 generating positive-pole DC power and an AC/negative-pole DC converter 132 generating negative-pole DC power, the AC/positive-pole DC converter 131 includes one or more three-phase valve bridges 131a corresponding respectively to one or more transformers 121 for the positive-pole, and the AC/negative-pole DC converter 132 includes one or more three-phase valve bridges 132a corresponding respectively to one or more transformers 122 for the negative-pole.

When one three-phase valve bridge 131a is used for the positive pole, the AC/positive-pole DC converter 131 may use AC power to generate positive-pole DC power having six pulses. In this case, the primary and secondary coils of the transformer 121 may have a Y-Y connection or Y-Δ connection.

When two three-phase bridges 131a are used for the positive pole, the AC/positive-pole DC converter 131 may use AC power to generate positive-pole DC power having twelve pulses. In this case, the primary and secondary coils of one of two transformers 121 may have a Y-Y connection, and the primary and secondary coils of the other of two transformers 121 may have a Y-Δ connection.

When three three-phase bridges 131a are used for the positive pole, the AC/positive-pole DC converter 131 may use AC power to generate positive-pole DC power having eighteen pulses. The more the number of pulses of the positive-pole DC power, the price of the filter may decrease.

When one three-phase bridge 132a is used for the negative pole, the AC/negative-pole DC converter 132 may generate negative-pole DC power having six pulses. In this case, the primary and secondary coils of the transformer 122 may have a Y-Y connection or Y-Δ connection.

When two three-phase bridges 132a are used for the negative pole, the AC/negative-pole DC converter 132 may generate negative-pole DC power having twelve pulses. In this case, the primary and secondary coils of one of two transformers 122 may have a Y-Y connection, and the primary and secondary coils of the other of two transformers 122 may have a Y-Δ connection.

When three three-phase bridges 132a are used for the negative pole, the AC/negative-pole DC converter 132 may generate negative-pole DC power having eighteen pulses. The more the number of pulses of the negative-pole DC power, the price of the filter may decrease.

The DC transmission part 140 includes a transmission-side positive-pole DC filter 141, a transmission-side negative-pole DC filter 142, a positive-pole DC transmission line 143, a negative-pole DC transmission line 144, a reception-side positive-pole DC filter 145, and a reception-side negative-pole DC filter 146.

The transmission-side positive-pole DC filter 141 includes an inductor L1 and a capacitor C1 and DC-filters positive-pole DC power output by the AC/positive-pole DC converter 131.

The transmission-side negative-pole DC filter 142 includes an inductor L3 and a capacitor C3 and DC-filters negative-pole DC power output by the AC/negative-pole DC converter 132.

The positive-pole DC transmission line 143 may have one DC line for transmission of positive-pole DC power, and earth may be used as a current feedback path. One or more switches may be disposed on the DC line.

The negative-pole DC transmission line 144 may have one DC line for transmission of negative-pole DC power, and earth may be used as a current feedback path. One or more switches may be disposed on the DC line.

The reception-side positive-pole DC filter 145 includes an inductor L2 and a capacitor C2 and DC-filters positive-pole DC power transmitted through the positive-pole DC transmission line 143.

The reception-side negative-pole DC filter 146 includes an inductor L4 and a capacitor C4 and DC-filters negative-pole DC power transmitted through the negative-pole DC transmission line 144.

The reception-side DC-AC converter part 150 includes a positive-pole DC/AC converter 151 and a negative-pole DC/AC converter 152, the positive-pole DC/AC converter 151 includes one or more three-phase valve bridges 151a, and the negative-pole DC/AC converter 152 includes one or more three-phase valve bridges 152a.

The reception-side transformer part 160 includes one or more transformers 161 corresponding respectively to one or more three-phase valve bridges 151a for the positive pole, and one or more transformers 162 corresponding respectively to one or more three-phase valve bridges 152a for the negative pole.

When one three-phase valve bridge 151a is used for the positive pole, the positive-pole DC/AC converter 151 may use positive-pole DC power to generate AC power having six pulses. In this case, the primary and secondary coils of the transformer 161 may have a Y-Y connection or Y-Δ connection.

When two three-phase valve bridges 151a are used for the positive pole, the positive-pole DC/AC converter 151 may use positive-pole DC power to generate AC power having twelve pulses. In this case, the primary and secondary coils of one of two transformers 161 may have a Y-Y connection, and the primary and secondary coils of the other of two transformers 161 may have a Y-Δ connection.

When three three-phase valve bridges 151a are used for the positive pole, the positive-pole DC/AC converter 151 may use positive-pole DC power to generate AC power having eighteen pulses. The more the number of pulses of the AC power, the price of the filter may decrease.

When one three-phase valve bridge 152a is used for the negative pole, the negative-pole DC/AC converter 152 may use negative-pole DC power to generate AC power having six pulses. In this case, the primary and secondary coils of the transformer 162 may have a Y-Y connection or Y-Δ connection.

When two three-phase valve bridges 152a are used for the negative pole, the negative-pole DC/AC converter 152 may use negative-pole DC power to generate AC power having twelve pulses. In this case, the primary and secondary coils of one of two transformers 162 may have a Y-Y connection, and the primary and secondary coils of the other of two transformers 162 may have a Y-Δ connection.

When three three-phase valve bridges 152a are used for the negative pole, the negative-pole DC/AC converter 152 may use negative-pole DC power to generate AC power having eighteen pulses. The more the number of pulses of the AC power, the price of the filter may decrease.

A reception-side AC part 170 includes an AC filter 171 and an AC transmission line 173.

The AC filter 171 removes other frequency components excluding the frequency component (e.g., about 60 Hz) used by the reception part 180, from the AC power generated by the reception-side transformation part 105.

The AC transmission line 173 transmits filtered AC power to the reception part 180.

Figure 4:
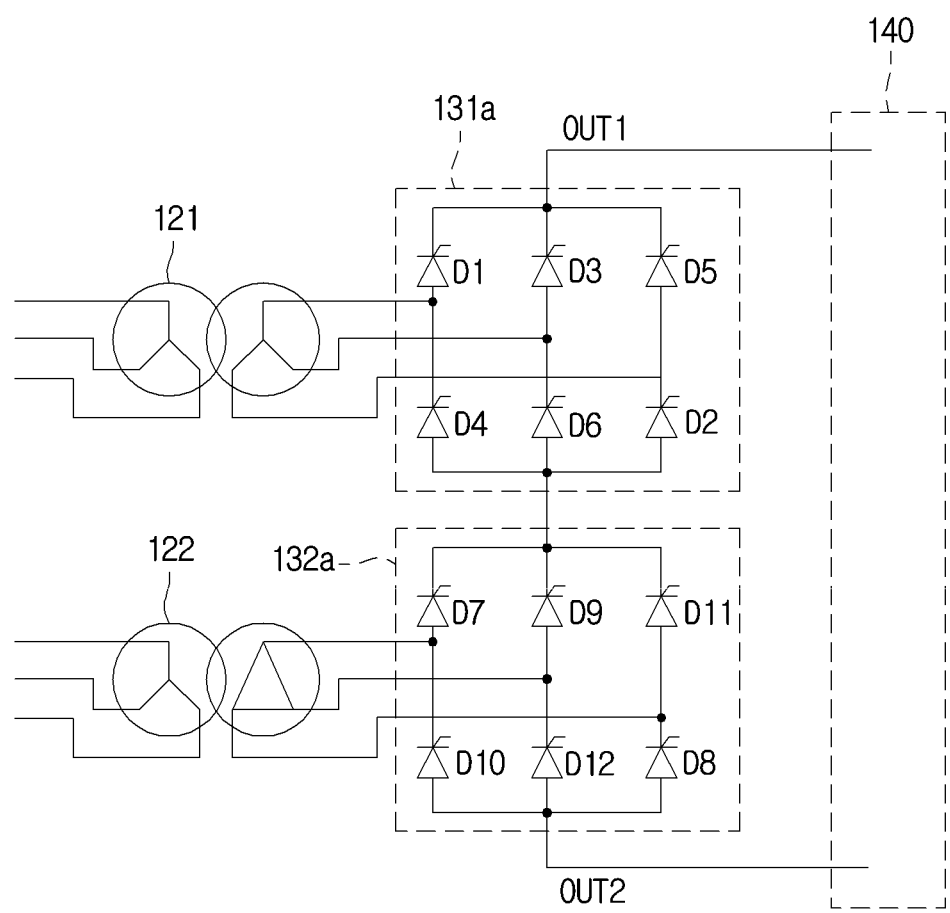
FIG. 4 shows the connection of a three-phase valve bridge and a transformer according to an embodiment.

FIG. 4 shows the connection of a three-phase valve bridge and a transformer according to an embodiment.

In particular, FIG. 4 shows the connection of two transformers 121 for a positive pole and two three-phase valve bridges 131a for the positive pole. Since the connection of two transformers 122 for a negative pole and two three-phase valve bridges 132a for the negative pole, the connection of two transformers 161 for the positive pole and two three-phase valve bridges 151a for the positive pole, the connection of two transformers 162 for the negative pole and two three-phase valve bridges 152a for the negative pole, the connection of a transformer 121 for the positive pole and a three-phase valve bridge 131a for the positive pole, the connection of a transformer 161 for the positive pole and a three-phase valve bridge 151a for the positive pole and so on may be easily driven from FIG. 4, their drawings and descriptions are omitted.

In FIG. 4, the transformer 121 having a Y-Y connection is referred to as an upper transformer, the transformer 121 having a Y-Δ connection is referred to as a lower transformer, the three-phase valve bridge 131a connected to the upper transformer is referred to as an upper three-phase valve bridge, and the three-phase valve bridge 131a connected to the lower transformer is referred to as a lower three-phase valve bridge.

The upper three-phase valve bridge and the lower three-phase valve bridge have a first output OUT1 and a second output OUT2 that are two outputs outputting DC power.

The upper three-phase valve bridge includes six valves D1 to D6 and the lower three-phase valve bridge includes six valves D7 to D12.

The valve D1 has a cathode connected to the first output OUT1 and an anode connected to a first terminal of the secondary coil of the upper transformer.

The valve D2 has a cathode connected to the anode of the valve D5 and an anode connected to the anode of the valve D6.

The valve D3 has a cathode connected to the first output OUT1 and an anode connected to a second terminal of the secondary coil of the upper transformer.

The valve D4 has a cathode connected to the anode of the valve D1 and an anode connected to the anode of the valve D6.

The valve D5 has a cathode connected to the first output OUT1 and an anode connected to a third terminal of the secondary coil of the upper transformer.

The valve D6 has a cathode connected to the anode of the valve D3.

The valve D7 has a cathode connected to the anode of the valve D6 and an anode connected to a first terminal of the secondary coil of the lower transformer.

The valve D8 has a cathode connected to the anode of the valve D11 and an anode connected to the second output OUT2.

The valve D9 has a cathode connected to the anode of the valve D6 and an anode connected to a second terminal of the secondary coil of the lower transformer.

The valve D10 has a cathode connected to the anode of the valve D7 and an anode connected to the second output OUT2.

The valve D11 has a cathode connected to the anode of the valve D6 and an anode connected to the third terminal of the secondary coil of the lower transformer.

The valve D12 has a cathode connected to the anode of the valve D9 and an anode connected to the second output OUT2.

Figure 5:
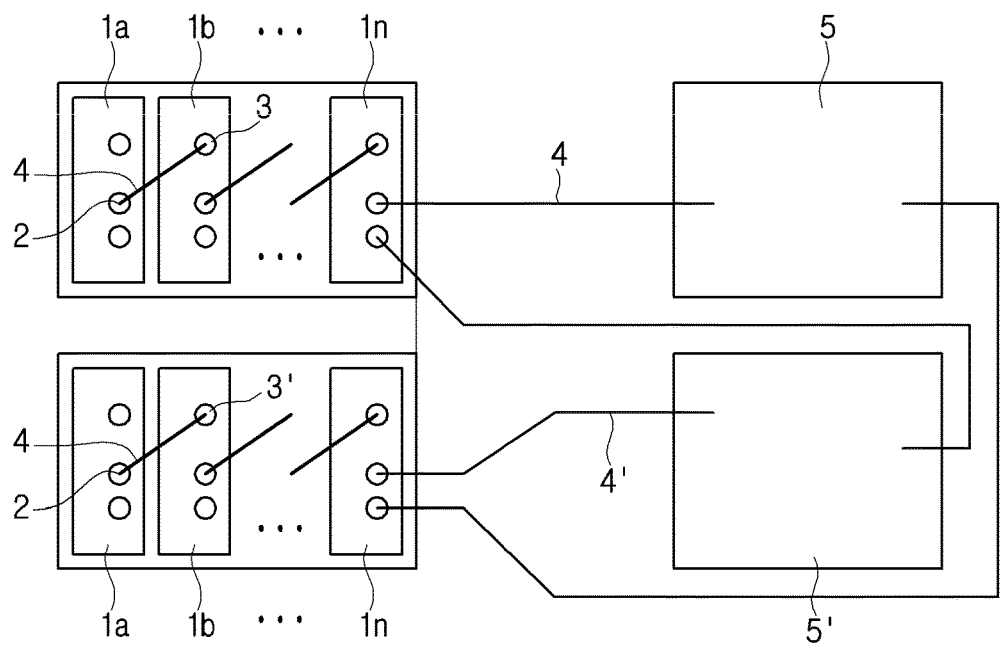
FIG. 5 is a diagram for explaining the configuration of a data processing device according to an embodiment.

FIG. 5 is a diagram for explaining the configuration of a data processing device according to an embodiment.

Referring to FIG. 5, a data processing device 200 includes a plurality of pre-processing groups 10a to 10n and a plurality of control units 5a to 5n.

The data processing device 200 may be included in the control part 190 of the HVDC transmission system in FIG. 1.

Each of the plurality of pre-processing groups 10a to 10n may include a plurality of pre-processing groups. The plurality of pre-processing groups 10a to 10n may correspond to the plurality of control units, respectively.

The output terminal of each of the plurality of pre-processing units 1a to 1n in a first pre-processing group 10a may be connected to the input terminal of the following pre-processing unit through an optical waveguide 4. Each of the plurality of pre-processing units 1a to 1n may transmit data to the input terminal of the following pre-processing unit through an output terminal 2.

The pre-processing unit 1n disposed at the very end may be connected to the control unit 5a through the optical waveguide 4.

The plurality of pre-processing units 1a to 1n may be connected to various measurement units (not shown).

The plurality of pre-processing units 1a to 1n may pre-process measurement values measured at the measurement unit, convert the values and transmit converted values to the plurality of control units 5a to 5n, respectively.

A first pre-processing unit 1a pre-processes the measurement value received from the measurement unit and outputs first pre-processed data.

The first pre-processed data output from the output terminal 2 of the first pre-processing unit 1a is transmitted to the input terminal 3 of the second pre-processing unit 1b through the optical waveguide 4. The first pre-processed data transmitted through the input terminal 3 of a second pre-processing unit 1b is transmitted to the input terminal of the following pre-processing unit along with second pre-processed data from the second pre-processing unit 1b. The pre-processed data received from the nth pre-processing unit 1n disposed at the very end is transmitted to the control unit 5a.

The plurality of control units 5a to 5n receive pre-processed data from the plurality of pre-processing groups, respectively.

Each of the plurality of control units 5a to 5n may code received pre-processed data and transmit coded data to the outside.

Figure 6:
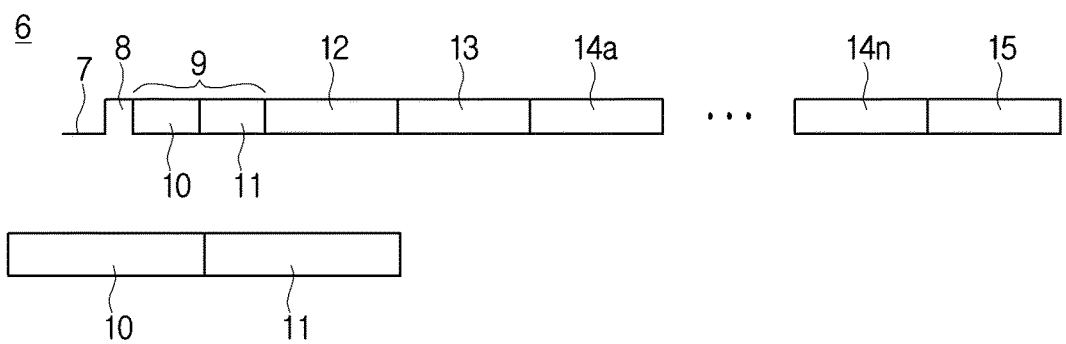
FIG. 6 is a diagram for explaining timing at which data is transmitted from each pre-processing unit according to an embodiment.

FIG. 6 is a diagram for explaining timing at which data is transmitted from each pre-processing unit according to an embodiment.

Referring to FIG. 6, a data word 6 starts from a synchronization signal 7 to which a start bit 8 is attached. A plurality of bit groups 9 to 14n and a check bit group 15 may be disposed behind the start bit 8.

A first bit group 9 may include two bit group elements 10 and 11. Each of the two bit group elements 10 and 11 has an 8-bit length.

A first bit group element 10 includes a bit sequence identifying each pre-processing unit. A second bit group element 11 includes information on a plurality of bit groups 12 to 15 following the first bit group 9. The plurality of bit groups 12 to 15 correspond to a plurality of measurement values, and state and check bit groups.

A second bit group 12 and a third bit group 13 include state information on measurement values measured from the measurement unit. The state information on the measurement values may be state information on the measurement values generated at the pre-processing unit. The state information on the measurement values may include information on the validity of the measurement values and information on whether a pre-processing has been performed.

The plurality of bit groups 14a to 14n flowing a third bit group 13 corresponds to the plurality of measurement values generated at the pre-processing unit, respectively.

The check bit group 15 following the plurality of bit groups 14a to 14n may be used to check whether data to be transmitted by using the data word 6 may be reliable data.

Figure 7:
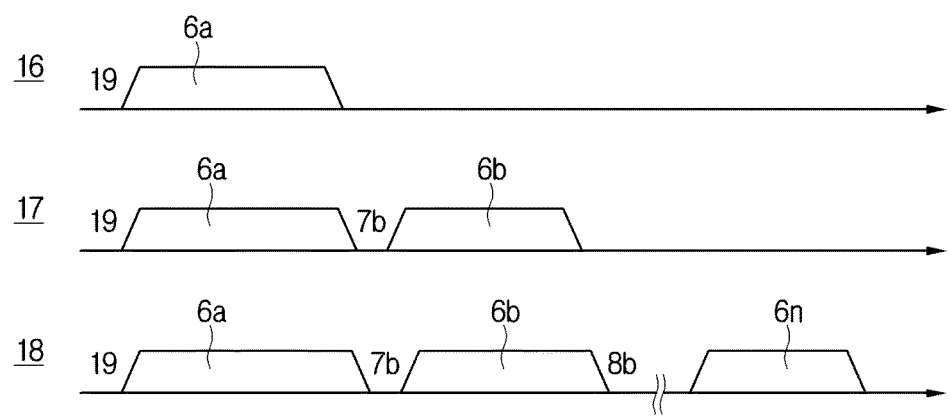
FIG. 7 shows data records having data words from each pre-processing unit according to an embodiment.

FIG. 7 shows data records having data words from each pre-processing unit according to an embodiment.

Referring to FIG. 7, each of the plurality of data words 6a to 6n corresponds to the data word in FIG. 6.

A first data record 16 includes a first data word 6a output from the first pre-processing unit 1a in FIG. 5.

A second data record 17 includes the first data word 6a and a second data word 6b output from the second pre-processing unit 1b in FIG. 5.

An nth data record 18 includes data words 6a to 6n output from the plurality of pre-processing units 1a to 1n.

The first pre-processing unit 1a may be used as a master and start data transmission by using a master synchronization signal 19.

The first pre-processing unit 1a transmits the first data word 6a having a format as shown in FIG. 6, after generating the master synchronization signal 19. As described in FIG. 6, the first data word 6a includes the second bit group element 11 including information on the number of the plurality of bit groups 12 to 15 following the first bit group 9.

The information on the number of the plurality of bit groups 12 to 15 may be used for determining an insertion time representing at which timing the second pre-processing unit 1b inserts its own synchronization signal 7b and the second data word 6b behind the first data word 6a. With the determination of the insertion time, the second data record 17 may be generated.

Each of the following pre-processing units may insert its synchronization signal and a data word to generate a data record in this way. Finally, an nth data record 18 may be generated.

Data output from the nth pre-processing unit 1n may be transmitted to the control unit 5 through the optical waveguide 4. The control unit 5 may perform an additional processing on the data output from the nth pre-processing unit 1n.

Figure 8:
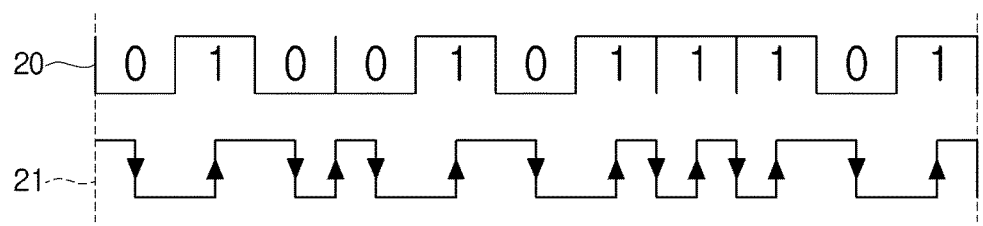
FIG. 8 is a diagram for explaining the process of coding measurement data according to an embodiment.

FIG. 8 is a diagram for explaining the process of coding measurement data according to an embodiment.

Each of the plurality of control units in FIG. 5 may use bi-phase coding to code each of the measurement values of the pre-processing units.

When the bi-phase coding is used, a measurement value may be expressed by 0 representing a low signal and 1 representing a high signal. The bi-phase coding does not permit a continuous low or high state in one data word.

Referring to FIG. 8, measurement data 20 representing a measurement value includes low signals and high signals. The control unit may code the measurement data 20 through the bi-phase coding and generate a coded transmission signal 21. The coded transmission signal 21 does not have a continuous low signal and a continuous high signal. Such coding allows a synchronization signal to be clearly represented on the transmission signal 21. In an embodiment, the master synchronization signal 19 generated at the first pre-processing unit 1a may be expressed so that 13 low signals are continuously represented, and each of synchronization signals 7b to 7n generated from remaining pre-preprocessing units excluding the first pre-processing unit 1a may be expressed so that 7 low signals are continuously represented.

Next, FIGS. 9 to 12 are described.

In FIGS. 9 to 12, the data transmission between components may be performed based on wavelength division multiplexing (WDM). The WDM indicates communicating a plurality of wavelengths through one optical fiber.

Figure 9:
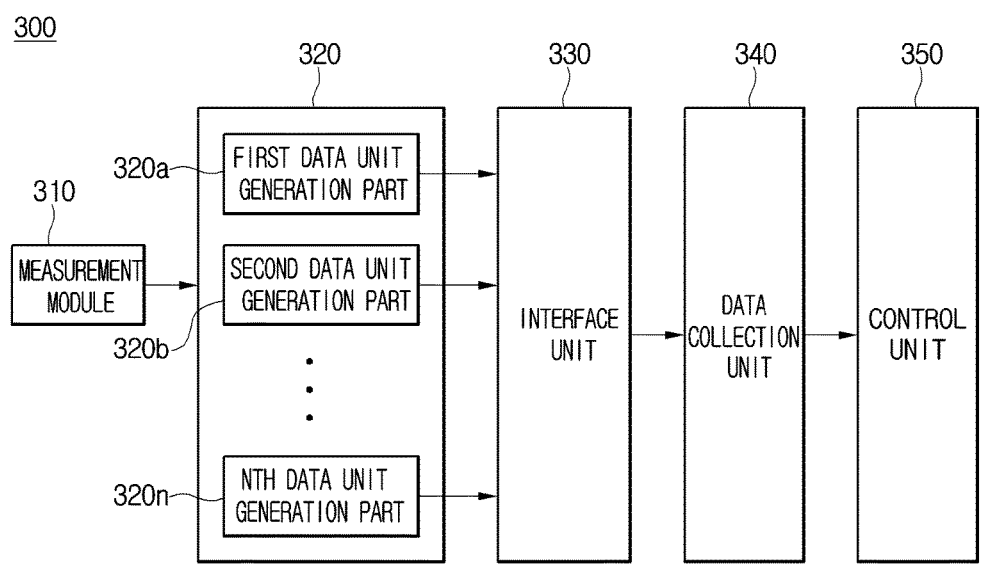
FIG. 9 is a block diagram of a data processing device according to another embodiment and FIG. 10 shows the actual configuration of a data processing device according to another embodiment.
Figure 10:
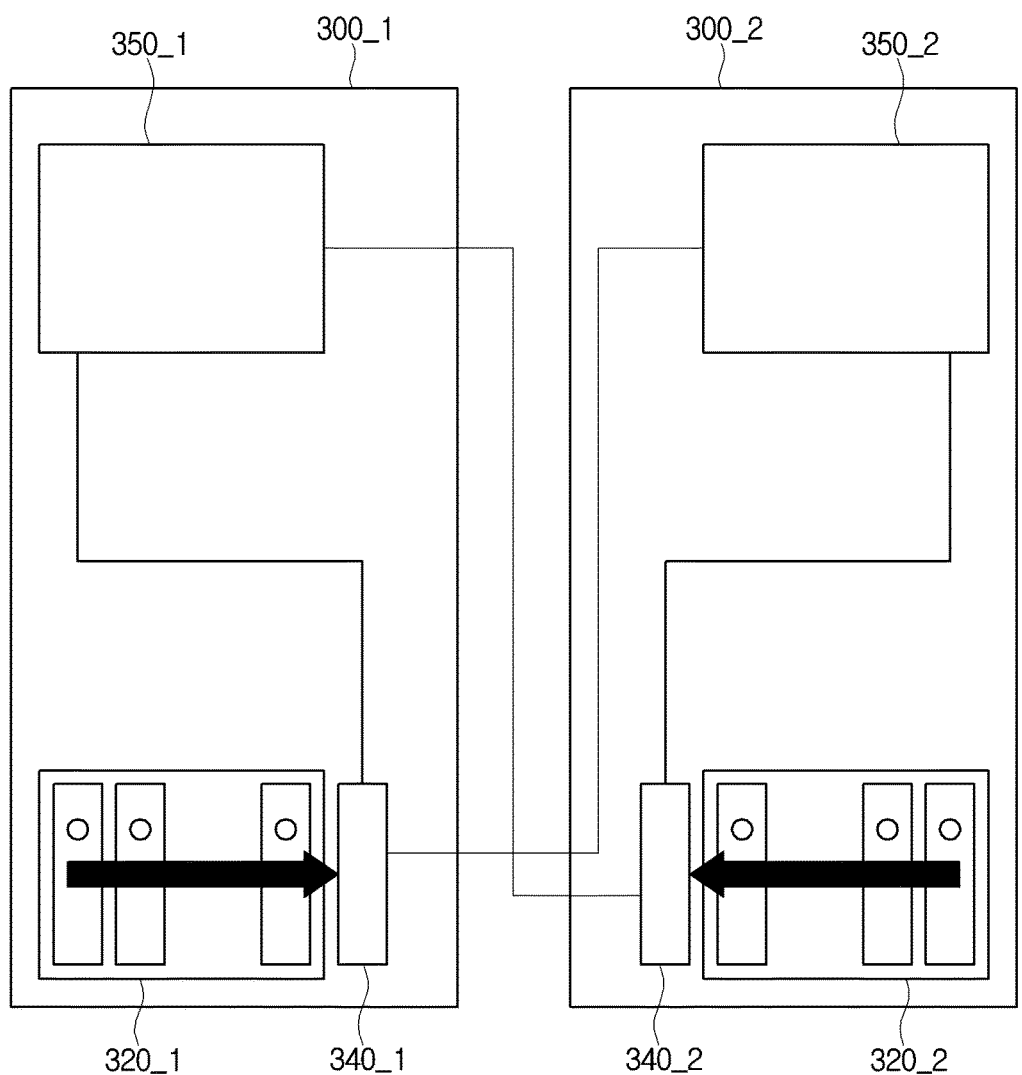

FIGS. 9 and 10 are diagrams for explaining the data processing device of an HVDC transmission system according to another embodiment.

FIG. 9 is a block diagram of a data processing device according to another embodiment and FIG. 10 shows the actual configuration of a data processing device according to another embodiment.

A data processing device 300 may be included in the control part 190 in FIG. 1, but the inventive concept has no need to be limited thereto and the data processing device may be a separate means.

Referring to FIG. 9, the data processing device 300 includes a measurement module 310, a data generation unit 320, an interface unit 330, a data collection unit 340, and a control unit 350.

The measurement module 310 obtains measurement values for one or more points in the HVDC transmission system. In an embodiment, the measurement module 310 may obtain measurement values for any one point in the HVDC transmission system in FIGS. 1 and 2. The measurement values may include an AC voltage for a point in the AC parts 110 and 170 and an AC current for a point in the AC parts 110 and 170. Also, the measurement values may include a DC voltage of the DC transmission part 140 and a DC current for a point in the DC transmission part 140. However, the inventive concept has no need to be limited thereto and the measurement values may include the voltage/current of the input or output terminal of a component configuring the HVDC transmission system.

The data generation unit 320 uses the measurement values obtained from the measurement module 310 to generate a measurement data unit. The data generation unit 320 may include a plurality of data unit generation parts 320a to 320n, and each of the plurality of data unit generation parts 320a to 320n may use measurement values obtained from the measurement module 310 to generate a measurement data unit. Each of the data unit generation parts 320a to 320n may pre-process measurement values received from the measurement module 310. Each of the plurality of data unit generation parts 320a to 320n may perform a preliminary process of removing unnecessary information from the measurement values so that the control unit 350 extracts valid values for the measurement values. Each of the plurality of data unit generation parts 320a to 320n may perform a preprocessing to generate a measurement data unit.

Each of the plurality of data unit generation parts 320a to 320n may transmit to the data collection unit 340 a measurement data unit pre-processed through the interface unit 330.

The interface unit 330 transmits, a plurality of measurement data units generated respectively from the plurality of data unit generation parts 320a to 320n, to the data collection unit 340.

The interface unit 330 transmits, the plurality of measurement data units generated respectively from the plurality of data unit generation parts 320a to 320n, to the data collection unit 340 in parallel.

The interface unit 330 may use a backplane bus specification to transmit the measurement data unit generated from each of the plurality of data unit generation parts 320a to 320n to the data collection unit 340. The interface unit 330 may connect the plurality of data unit generation parts 320a to 320n and the data collection unit 320 to function as a path for the transmission of the measurement data unit.

The data collection unit 340 collects the plurality of measurement data units transmitted through the interface unit 330.

In an embodiment, the data collection unit 340 may collect the plurality of measurement data units transmitted through the interface unit 330 simultaneously. That is, the data collection unit 340 may simultaneously collect the plurality of measurement data units through the backplane bus specification.

The data collection unit 340 may function as a buffer. That is, the data collection unit 340 may be utilized as a temporary storage temporarily storing data when data is transmitted and received between the plurality of data unit generation parts 320a to 320n and the control unit 350.

The data collection unit 340 may be named a gate module.

The data collection unit 340 generates a measurement data packet based on the plurality of measurement data units collected.

In an embodiment, the data collection unit 340 may use a plurality of measurement data units to generate one measurement data packet.

The data collection unit 340 may code a generated measurement data packet to generate a coded measurement data packet. The data collection unit 340 may code each of the plurality of measurement data units and use a coding result to generate one measurement data packet.

The data collection unit 340 transmits the generated data packet to the control unit 350.

The control unit 350 provides the received measurement data packet to the outside based on a trigger.

The trigger may be a motive for initiating the transmission of the measurement data packet.

In an embodiment, the trigger may be generated at regular time intervals. That is, the control unit 350 may provide the measurement data packet to the outside at defined time intervals.

In another embodiment, the trigger may be generated at irregular time intervals. The control unit 350 may provide the measurement data packet to the outside at irregular time intervals.

In another embodiment, the trigger may be a request from another control unit. That is, a first control unit 350_1 in FIG. 10 may provide a measurement data packet to a second control unit 350_2 by a request from the second control unit 350_2. Likewise, the second control unit 350_2 may provide a measurement data packet to the first control unit 350_1 by a request from the first control unit 350_1.

The first control unit 350_1 or the second control unit 350_2 may use an optical cable to transmit and receive a measurement data packet.

In another embodiment, the trigger may be a request from a user. The control unit 350 may provide a measurement data packet to a user terminal according to a request from the user. In this example, the user terminal may be a computer, a notebook computer, or a mobile terminal, such as a smart phone but the inventive concept has no need to be limited thereto.

FIG. 10 shows a first data processing device 300_1 and a second data processing device 300_2. The configuration of each of the first data processing device 300_1 and the second data processing device 300_2 is the same as that in FIG. 9. However, some components have been omitted.

The first control unit 350_1 may transmit a measurement data packet from the first data processing device 300_1 to the second control unit 350_2 through a second data collection unit 340_2.

The second control unit 350_2 may transmit a measurement data packet from the second data processing device 300_2 to the first control unit 350_1 through a first data collection unit 340_1.

Figure 11:
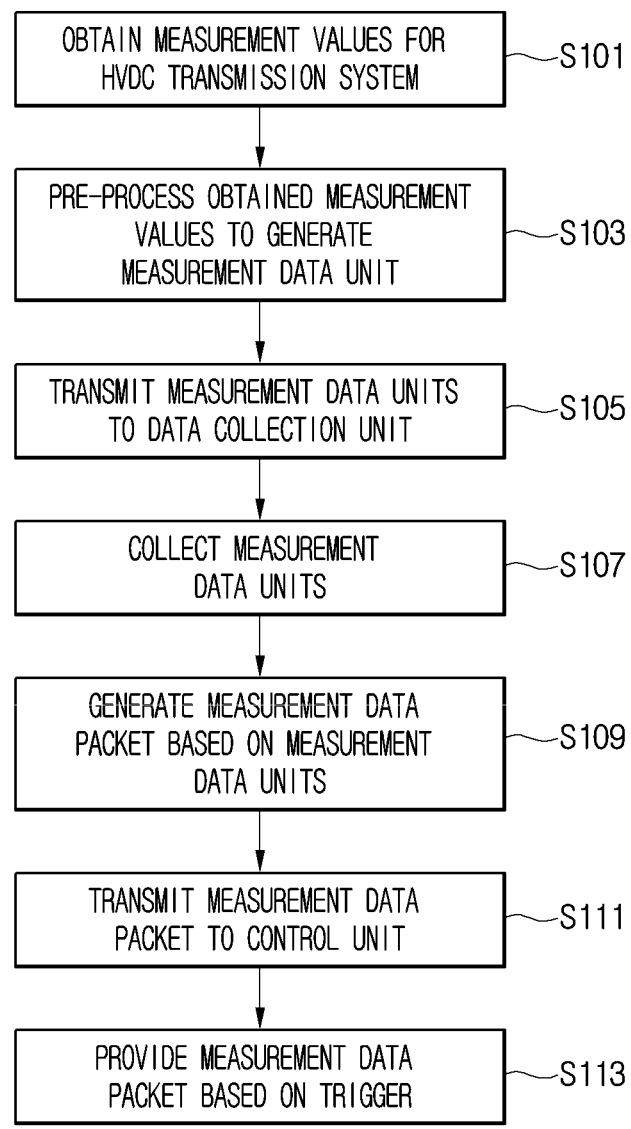
FIG. 11 is a flow chart of an operating method of a data processing device according to an embodiment.

Next, FIG. 11 is described.

FIG. 11 is a flow chart of an operating method of a data processing device according to an embodiment.

Referring to FIG. 11, the measurement module 310 of the data processing device 300 obtains measurement values for one or more points in an HVDC transmission system in step S101.

In an embodiment, the measurement module 310 may obtain measurement values for any one point in the HVDC transmission system in FIGS. 1 and 2. The measurement values may include an AC voltage for a point in the AC parts 110 and 170 and an AC current for a point in the AC parts 110 and 170. Also, the measurement values may include a DC voltage of the DC transmission part 140 and a DC current for a point in the DC transmission part 140. However, the inventive concept has no need to be limited thereto and the measurement values may include the voltage/current of the input or output terminal of a component configuring the HVDC transmission system.

The measurement module 310 may include a plurality of measurement units (not shown). Each of the plurality of measurement units may transmit measurement values to a plurality of data unit generation parts 320a to 320n.

Each of the plurality of data unit generation parts 320a to 320n uses the measurement values obtained from the measurement module 310 to generate a measurement data unit in step S103.

Each of the plurality of data unit generation parts 320a to 320n may pre-process measurement values received from the measurement module 310. Each of the plurality of data unit generation parts 320a to 320n may perform a preliminary process of removing unnecessary information from the measurement values so that a control unit 350 extracts valid values for the measurement values. Each of the plurality of data unit generation parts 320a to 320n may perform a preprocessing to generate a measurement data unit.

Each of the plurality of data unit generation parts 320a to 320n may transmit to the data collection unit 340 a measurement data unit pre-processed through the interface unit 330.

The interface unit 330 transmits, a plurality of measurement data units generated respectively from the plurality of data unit generation parts 320a to 320n, to the data collection unit 340 in step S105.

The interface unit 330 may use a backplane bus specification to transmit the measurement data unit generated from each of the plurality of data unit generation parts 320a to 320n to the data collection unit 340. The interface unit 330 may connect the plurality of data unit generation parts 320a to 320n and the data collection unit 320 to function as a path for the transmission of the measurement data unit.

The interface unit 330 may transmit the plurality of measurement data units to the data collection unit 340 through one optical cable. That is, the plurality of data unit generations parts 320a to 320n may share one optical cable.

Thus, the interface unit 330 may transmit the plurality of measurement data units through one cable in parallel. In this case, the interface unit 330 may use WDM to transmit the plurality of measurement data units to the data collection unit 340.

The data collection unit 340 collects the plurality of measurement data units transmitted through the interface unit 330 in step S107.

In an embodiment, the data collection unit 340 may simultaneously collect the plurality of measurement data units transmitted through the interface unit 330. That is, the data collection unit 340 may simultaneously collect the plurality of measurement data units through the backplane bus specification.

The data collection unit 340 may function as a buffer. That is, the data collection unit 340 may be utilized as a temporary storage temporarily storing data when data is transmitted and received between the plurality of data unit generation parts 320a to 320n and the control unit 350.

The data collection unit 340 may be named a gate module.

The data collection unit 340 generates a measurement data packet based on the plurality of measurement data units collected, in step S109.

In an embodiment, the data collection unit 340 may use the plurality of measurement data units to generate one measurement data packet.

The data collection unit 340 may code a generated measurement data packet to generate a coded measurement data packet. The data collection unit 340 may code each of the plurality of measurement data units and use a coding result to generate one measurement data packet.

The structure of the measurement data packet is described with reference to FIG. 12.

Figure 12:
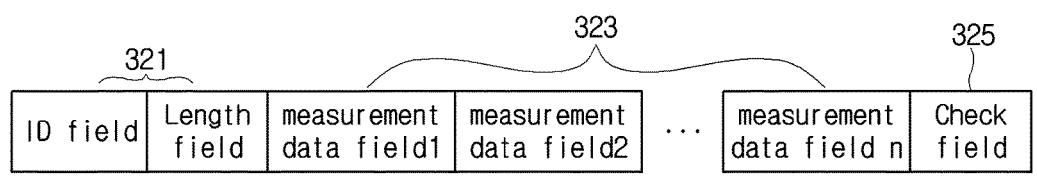
FIG. 12 is a diagram for explaining the structure of a measurement data packet according to an embodiment.

FIG. 12 is a diagram for explaining the structure of a measurement data packet according to an embodiment.

Referring to FIG. 12, the measurement data packet may include a header 321, measurement data 323 and check code 325.

The header 321 includes an identifier field and a length field.

The identifier ID field is a field identifying a measurement data packet.

The length field is a field representing the lengths of the measurement data 323 and the check code 325 following the header 321.

The header 321 may not include the header of each measurement data unit. Each measurement data unit may not include the header. Thus, the header of the measurement data packet may include only information representing a measurement data packet simply.

The header 321 is followed by the measurement data 323 and the check code 325.

The measurement data 323 includes information on the plurality of measurement values pre-processed at the data unit generation part. The measurement data 323 includes a plurality of measurement data fields 1 to n. The plurality of measurement data fields corresponds to the plurality of data unit generation parts, respectively. That is, each of the plurality of measurement data fields may represent the plurality of measurement values received from the plurality of data unit generation parts.

The measurement data 323 is followed by the check code 325.

The check code 325 is used for checking whether the measurement data packet is a reliable data unit. That is, the check code 325 may be used for checking an error in the measurement data packet. The check code 325 may be cyclic redundancy check (CRC) code, which is only an example.

In the case of the measurement data packet in FIG. 12, it is possible to decrease the number of headers compared to that in FIG. 6. That is, a plurality of data records according to the embodiment in FIG. 6 includes a plurality of headers for each pre-processing unit. However, since the measurement data packet according to the embodiment in FIG. 12 includes only one header, the embodiment in FIG. 12 may relatively decrease overhead.

According to an embodiment, since the measurement data unit transmitted from the plurality of data unit generation parts is not time-divided in transmission, there is an effect in that it is insensitive to transmission synchronization.

According to an embodiment, since the measurement data unit transmitted from the plurality of data unit generation parts is transmitted through one interface, it is possible to decrease the number of cable lines and the structure of a system is simplified.

Refer back to FIG. 11.

The data collection unit 340 transmits a generated data packet to the control unit 350 in step S111.

In an embodiment, the data collection unit 340 may uses WDM to transmit the measurement data packet to the control unit 350. The WDM indicates communicating a plurality of wavelengths through one optical fiber.

The control unit 350 provides the received measurement data packet to the outside based on a trigger in step S113.

The trigger may be synchronization initiating the transmission of the measurement data packet.

In an embodiment, the trigger may be temporal synchronization preset in the data processing device 300. The trigger may be generated at regular time intervals. That is, the control unit 350 may provide the measurement data packet to the outside at defined time intervals.

Also, the trigger may be generated at irregular time intervals. The control unit 350 may provide the measurement data packet to the outside at irregular time intervals.

In another embodiment, the trigger may be a request from another control unit. That is, a first control unit 350_1 in FIG. 10 may provide a measurement data packet to a second control unit 350_2 by a request from the second control unit 350_2. Likewise, the second control unit 350_2 may provide a measurement data packet to the first control unit 350_1 by a request from the first control unit 350_1.

The first control unit 350_1 or the second control unit 350_2 may use an optical cable to transmit and receive a measurement data packet.

In another embodiment, the trigger may be a request from a user. The control unit 350 may provide a measurement data packet to a user terminal according to a request from the user. In this example, the user terminal may be a computer, a notebook computer, or a mobile terminal, such as a smart phone but the inventive concept has no need to be limited thereto.

Figure 13:
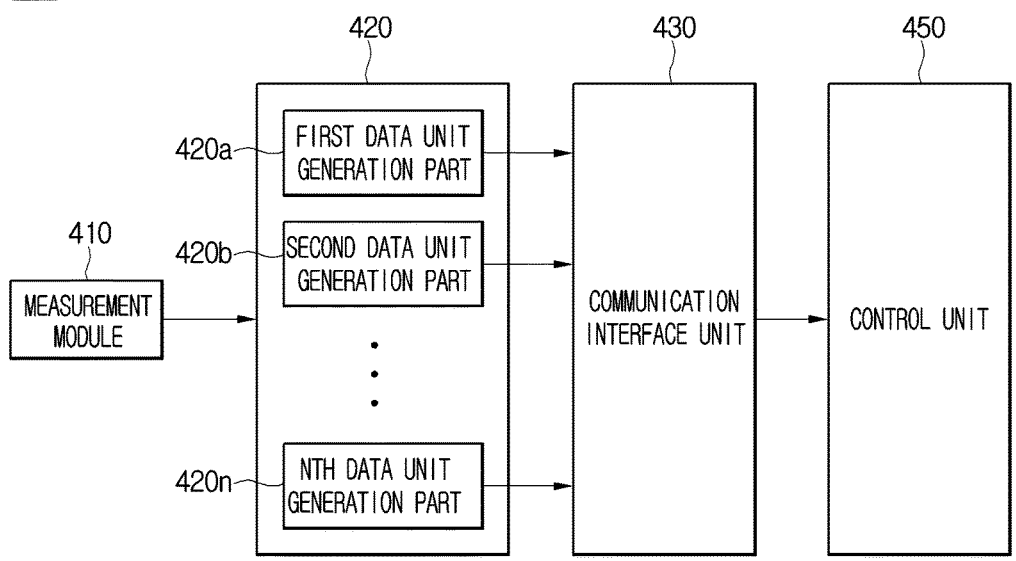
FIG. 13 is a diagram for explaining the configuration of a data processing device according to another embodiment.

FIG. 13 is a diagram for explaining the configuration of a data processing device according to another embodiment.

Referring to FIG. 13, a data processing device 400 includes a measurement module 410, a data processing unit 420, a communication interface unit 430, and a control unit 450.

The measurement module 410 obtains measurement values for one or more points in an HVDC transmission system. In an embodiment, the measurement module 410 may obtain measurement values for any one point in the HVDC transmission system in FIGS. 1 and 2. The measurement values may include an AC voltage for a point in the AC parts 110 and 170 and an AC current for a point in the AC parts 110 and 170. Also, the measurement values may include a DC voltage of a DC transmission part 140 and a DC current for a point in the DC transmission part 140. However, the inventive concept has no need to be limited thereto and the measurement values may include the voltage/current of the input or output terminal of a component configuring the HVDC transmission system.

The data processing unit 420 uses the measurement values obtained from the measurement module 410 to generate a measurement data unit.

The data processing and control unit 420 may include a plurality of data unit generation parts 420a to 420n, and each of the plurality of data unit generation parts 420a to 420n may use measurement values obtained from the measurement module 410 to generate a measurement data unit. Each of the plurality of data unit generation parts 420a to 420n may pre-process measurement values received from the measurement module 410. Each of the plurality of data unit generation parts 420a to 420n may perform a preliminary process of removing unnecessary information from the measurement values so that a control unit 450 extracts valid values for the measurement values. Each of the plurality of data unit generation parts 420a to 420n may perform a preprocessing to generate a measurement data unit.

Each of the plurality of data unit generation parts 420a to 420n may transmit the measurement data unit which it has generated, to the following data unit generation part through TDM.

The communication module 430 may use WDM to transmit the received measurement data units to the control unit 450. The communication module 430 may transmit a plurality of measurement data units to the control unit 450 in parallel. The communication module 430 may use WDM to transmit the plurality of measurement data units to the control unit 450. The WDM allocates data to each of a plurality of wavelength bands to transmit it through an optical fiber. Since the optical fiber may transmit a large amount of data over a significantly wide frequency domain, the WDM is economical and has an effect in that a transmission rate increases.

The WDM is described with reference to FIG. 14.

Figure 14:
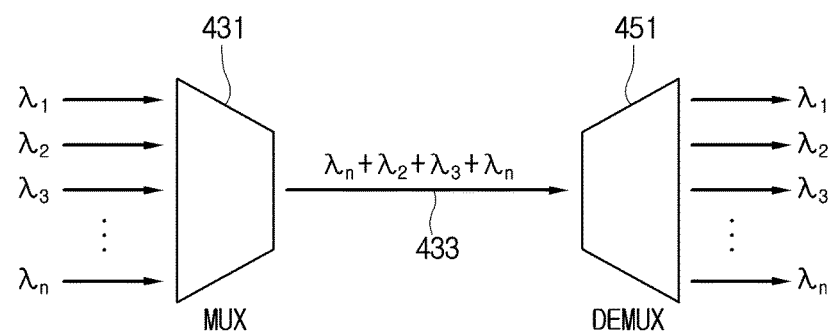
FIG. 14 is a diagram for explaining a data transmission method using WDM according to an embodiment of the present invention.

FIG. 14 is a diagram for explaining a data transmission method using WDM according to an embodiment of the present invention.

Referring to FIG. 14, a communication module 430 may include a multiplexer 431 and an optical fiber 433. Although FIG. depicts that the optical fiber 433 is included in the communication module 430, the inventive concept has no need to be limited thereto and the optical fiber may be a separate component.

The multiplexer 431 may perform multiplexing on the measurement data units allocated to the plurality of wavelength bands Xi to Li to output a piece of data.

The optical fiber 433 may transmit the data output from the multiplexer 431 to the demultiplexer 451 of a control unit 450.

The demultiplexer 451 may perform demultiplex on the multiplexed data to obtain a plurality of wavelength bands.

Refer back to FIG. 13.

The communication module 430 may allocate the measurement data units received from the plurality of data unit generation parts 420a to 420n to the plurality of wavelength bands respectively to transmit the allocated data unit to the control unit 450.

In an embodiment, the communication module 430 may transmit a plurality of measurement data units to the control unit 450 in parallel. The optical fiber includes a core region and a cladding region surrounding the core region. One or more cores may be included in the core region.

When the optical fiber includes a plurality of cores, the communication module 430 may allocate a measurement data unit to each of the plurality of cores to transmit the allocated data unit to the control unit 450.

A plurality of wavelength bands may be allocated to each of the plurality of cores. Each of a plurality of cores may also be allocated the same number of wavelength bands. When one optical fiber includes a plurality of cores, a large amount of data may be transmitted at the same time.

In an embodiment, the plurality of cores may correspond respectively to the plurality of data unit generation parts configuring the data processing unit 420. Thus, the plurality of cores may transmit a measurement data unit from the plurality of data unit generation parts respectively to the control unit 450.

In another embodiment, each of the plurality of cores may correspond to at least two data unit generation parts. In this case, the communication module 430 may allocate a wavelength band to each of the plurality of cores, and each of the plurality of cores may transmit two or more measurement data units to the control unit 450 through an allocated wavelength band.

The communication module 430 may set a priority to the plurality of cores and transmit a measurement data unit according to a set priority. In particular, when a measurement value measured at any one of the plurality of measurement units needs to be first transmitted, the communication module 430 may first transmit a measurement data unit through a core having a top priority among the plurality of cores.

The control unit 450 may control the overall operations of the data processing device 400.

The control unit 450 may code the measurement data units received from the communication module 430 to provide a coding result to the outside.

The control unit 450 may use bi-phase coding to code the measurement data units.

Figure 15:
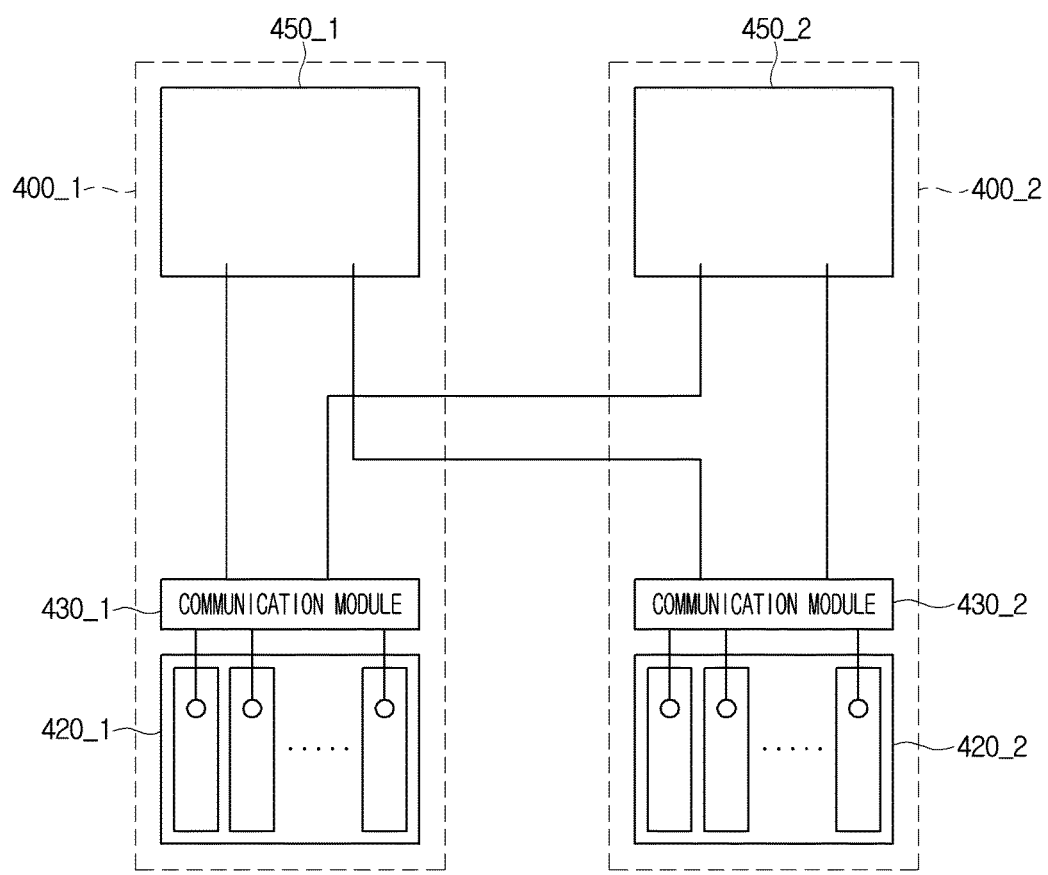
FIG. 15 shows an example of the actual configuration of a data processing device according to another embodiment.

FIG. 15 shows an example of the actual configuration of a data processing device according to another embodiment.

FIG. 15 shows a first data processing device 400_1 and a second data processing device 400_2. The configuration of each of the first data processing device 400_1 and the second data processing device 400_2 is similar to that in FIG. 13. However, some components have been omitted.

A first data processing unit 420_1 transmits a plurality of measurement data units to a first communication module 430_1.

The first communication module 430_1 transmits the plurality of measurement data units received to a first control unit 450_1 by using WDM.

A second data processing unit 420_2 transmits a plurality of measurement data units to a second communication module 430_2.

A second communication module 430_2 transmits the plurality of measurement data units received to a second control unit 450_2 by using WDM.

The first control unit 450_1 may receive the measurement data units generated by the second data processing unit 420_2, from the second communication module 430_2. Even in this case, WDM may be used.

The second control unit 450_2 may receive the measurement data units generated by the first data processing unit 420_1, from the first communication module 430_1. Even in this case, WDM may be used.

Each control unit may provide the received measurement data units to the outside based on a trigger. The trigger may be synchronization initiating the transmission of a measurement data packet.

In an embodiment, the trigger may be temporal synchronization preset in the data processing device 400. The trigger may be generated at regular time intervals. That is, the control unit 450 may provide measurement data units to the outside at defined time intervals.

Also, the trigger may be generated at irregular time intervals. The control unit 450 may provide the measurement data units to the outside at irregular time intervals.

In another embodiment, the trigger may be a request from another control unit. That is, the first control unit 450_1 in FIG. 15 may provide measurement data units to the second control unit 450_2 by a request from the second control unit 450_2. Likewise, the second control unit 450_2 may provide measurement data units to the first control unit 450_1 by a request from the first control unit 450_1.

The first control unit 450_1 or the second control unit 450_2 may use an optical cable to transmit and receive measurement data units.

In another embodiment, the trigger may be a request from a user. The control unit 350 may provide measurement data units to a user terminal according to a request from the user.

In this example, the user terminal may be a computer, a notebook computer, a mobile terminal, such as a smart phone, etc. but the inventive concept is not limited thereto.

Figure 16:
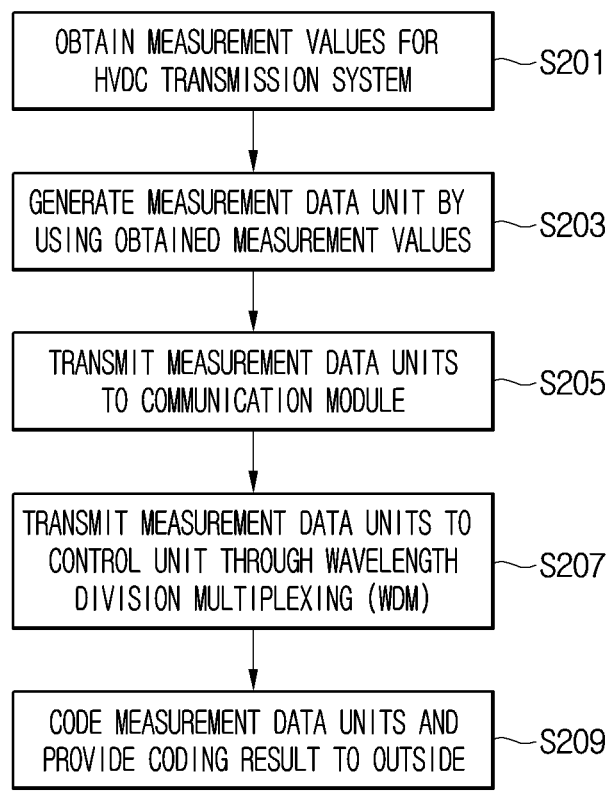
FIG. 16 is a flow chart of an operating method of a data processing device according to another embodiment.

FIG. 16 is a flow chart of an operating method of a data processing device according to another embodiment.

Referring to FIG. 16, the measurement module 410 of the data processing device 400 obtains measurement values for one or more points in an HVDC transmission system in step S201.

In an embodiment, the measurement module 410 may obtain measurement values for any one point in the HVDC transmission system in FIGS. 1 and 2. The measurement values may include an AC voltage for a point in the AC parts 110 and 170 and an AC current for a point in the AC parts 110 and 170. Also, the measurement values may include a DC voltage of a DC transmission part 140 and a DC current for a point in the DC transmission part 140. However, the inventive concept has no need to be limited thereto and the measurement values may include the voltage/current of the input or output terminal of a component configuring the HVDC transmission system.

The measurement module 410 may include a plurality of measurement units (not shown). Each of the plurality of measurement units may transmit measurement values to a plurality of data unit generation parts 420a to 420n. That is, the plurality of measurement units may correspond to the plurality of data unit generation parts 420a to 420n, respectively.

Each of the plurality of data unit generation parts 420a to 420n uses the measurement values obtained from the measurement module 410 to generate a measurement data unit in step S203.

Each of the plurality of data unit generation parts 420a to 420n may pre-process measurement values received from the measurement module 410. Each of the plurality of data unit generation parts 420a to 420n may perform a preliminary process of removing unnecessary information from the measurement values so that a control unit 450 extracts valid values for the measurement values. Each of the plurality of data unit generation parts 420a to 420n may perform a preprocessing to generate a measurement data unit.

Each of the plurality of data unit generation parts 420a to 420n transmits a generated measurement data unit to the communication module 430 in step S205.

The communication module 430 uses WDM to transmit the received measurement data units to the control unit 450 in step S207.

The communication module 430 may transmit a plurality of measurement data units to the control unit 450 in parallel. The communication module 430 may use WDM to transmit the plurality of measurement data units to the control unit 450. The WDM allocates data to each of a plurality of wavelength bands to transmit it through an optical fiber. Since the optical fiber may transmit a large amount of data over a significantly wide frequency domain, the WDM is economical and has an effect in that a transmission rate increases.

The communication module 430 may allocate the measurement data units received from the plurality of data unit generation parts 420a to 420n to the plurality of wavelength bands respectively to transmit the allocated data unit to the control unit 450.

In an embodiment, the communication module 430 may transmit a plurality of measurement data units to the control unit 450 through one optical fiber. The optical fiber includes a core region and a cladding region surrounding the core region. One or more cores may be included in the core region.

When the optical fiber includes a plurality of cores, the communication module 430 may allocate measurement data units to the plurality of cores respectively to transmit the allocated data unit to the control unit 450.

A plurality of wavelength bands may be allocated to each of the plurality of cores. Each of a plurality of cores may also be allocated the same number of wavelength bands. When one optical fiber includes a plurality of cores, a large amount of data may be transmitted at the same time.

In an embodiment, the plurality of cores may correspond respectively to the plurality of data unit generation parts configuring the data processing unit 420. Thus, the plurality of cores may transmit a measurement data unit from the plurality of data unit generation parts respectively to the control unit 450.

In another embodiment, each of the plurality of cores may correspond to at least two data unit generation parts. In this case, the communication module 430 may allocate a wavelength band to each of the plurality of cores, and each of the plurality of cores may transmit two or more measurement data units to the control unit 450 through an allocated wavelength band.

The communication module 430 may set a priority to the plurality of cores and transmit a measurement data unit according to a set priority. In particular, when a measurement value measured at any one of the plurality of measurement units needs to be first transmitted, the communication module 430 may first transmit a measurement data unit through a core having a top priority among the plurality of cores.

Time division multiplexing (TDM) has limitations in that the bottleneck of a channel increases with an increase in the number of data unit generation parts and the TDM is sensitive to transmission synchronization. Also, the TDM has a limitation in that it is possible to satisfy system requirements only at a high data transmission rate.

However, since the data processing device 400 according to an embodiment allocates each measurement data unit to a specific wavelength band and transmits it parallel, it is possible to lower the bottleneck of the channel even when the number of the data unit generation parts is large, and it is possible to satisfy system requirements even when the data transmission rate is not high.

The control unit 450 may code the measurement data units received from the communication module 430 to provide a coding result to the outside in step S209.

According to an embodiment, the above-described method may also be embodied as processor readable codes on a program-recorded medium. Examples of the processor readable medium are a ROM, a RAM, a CD-ROM, a magnetic tape, a floppy disk, and an optical data storage device, and the method is also implemented in the form of a carrier wave (such as data transmission through the Internet).

According to various embodiments, it is possible to decrease sensitivity to transmission synchronization even when the measurement data unit is transmitted through TDM.

Also, it is possible to decrease the number of optical cables through serial transmission and there is an effect in that the structure of a system is simplified.

The above-described embodiments are not limited to the above-described configuration and method, and some or all of the embodiments may also be selectively combined so that various variations may be implemented.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A data processing device in a high voltage direct current (HVDC) transmission system, the device comprising:
   a measurement module measuring a voltage or current for one or more points in the HVDC system, wherein the measurement module includes a plurality of measurement units;
   a data processing unit generating measurement data units based on measurements by the measurement module; and
   a communication module transmitting the generated measurement data units externally via one optical fiber using wavelength division multiplexing,
   wherein the optical fiber comprises a plurality of cores,
   wherein each of the plurality of cores corresponds to one or more of the generated measurement data units,
   wherein the communication module transmits the generated measurement data units via the plurality of cores, and
      wherein the communication module is further configured to:
      set a priority to each of the plurality of cores, and
      when a measurement value measured at any one of the plurality of measurement units needs to be first transmitted, transmit externally a measurement data unit through a core having a top priority among the plurality of cores, and
   wherein the data processing device further comprises a control unit configured to transmit the measurement data units to a second control unit of a second data processing device after receiving a trigger for initiating a transmission of the measurement data units from the second control unit.

2. The device according to claim 1, wherein:
   the data processing unit comprises a plurality of data unit generation parts; and
   each of the plurality of data unit generation parts uses measurements by the measurement module to generate a least one of the measurement data units and transmits the generated measurement data unit to the communication module.

3. The device according to claim 2, wherein each of the plurality of cores corresponds to one of the plurality of data unit generation parts.

4. The device according to claim 2, wherein each of the plurality of cores corresponds to at least two data unit generation parts.

5. The device according to claim 1, wherein the communication module transmits the measurement data units in parallel.

6. The device according to claim 5, wherein the communication module allocates a plurality of wavelength bands to each of the generated measurement data units.

7. The device according to claim 1, further comprising a control unit coding the generated measurement data units and transmitting a result of the coding externally.

8. The device according to claim 2, wherein each of the plurality of data unit generation parts pre-processes the measurements by the measurement module in order to generate pre-processed measurement data units.

* * * * *